(12) United States Patent
Bellan et al.

(10) Patent No.: US 10,978,396 B2
(45) Date of Patent: Apr. 13, 2021

(54) TRANSIENT ELECTRONICS USING THERMORESPONSIVE MATERIALS

(71) Applicant: VANDERBILT UNIVERSITY, Nashville, TN (US)

(72) Inventors: Leon Bellan, Nashville, TN (US); Xin Zhang, Nashville, TN (US)

(73) Assignee: VANDERBILT UNIVERSITY, Nashville, TN (US)

( * ) Notice: Subject to any disclaimer, the term of this patent is extended or adjusted under 35 U.S.C. 154(b) by 162 days.

(21) Appl. No.: 15/817,873

(22) Filed: Nov. 20, 2017

(65) Prior Publication Data

US 2018/0174976 A1    Jun. 21, 2018

Related U.S. Application Data

(60) Provisional application No. 62/468,627, filed on Mar. 8, 2017, provisional application No. 62/402,602, filed on Sep. 30, 2016.

(51) Int. Cl.

| | | |
|---|---|---|
| H01L 23/498 | (2006.01) | |
| H01L 23/532 | (2006.01) | |
| H01B 1/22 | (2006.01) | |
| H01L 23/00 | (2006.01) | |
| H01L 49/02 | (2006.01) | |
| H01L 21/288 | (2006.01) | |

(Continued)

(52) U.S. Cl.
CPC ......... *H01L 23/53242* (2013.01); *H01B 1/22* (2013.01); *H01L 21/288* (2013.01); *H01L 23/5223* (2013.01); *H01L 23/5329* (2013.01); *H01L 23/564* (2013.01); *H01L 28/60* (2013.01); *H05K 1/0313* (2013.01); *H01L 21/0274* (2013.01); *H01L 21/31138* (2013.01); *H01L 23/145* (2013.01); *H01L 23/49866* (2013.01); *H01L 23/49894* (2013.01); *H01L 23/528* (2013.01); *H01L 23/5227* (2013.01); *H01L 23/5228* (2013.01); *H01L 33/62* (2013.01); *H01L 2933/0066* (2013.01); *H05K 1/097* (2013.01); *H05K 1/16* (2013.01); *H05K 3/207* (2013.01); *H05K 2201/026* (2013.01); *H05K 2203/178* (2013.01)

(58) Field of Classification Search
CPC ................................................. H05K 2203/178
See application file for complete search history.

(56) References Cited

U.S. PATENT DOCUMENTS 8,545,830 B2 * 10/2013 Lowe ...................... A61K 9/06
                                                                424/400
8,666,471 B2    3/2014 Rogers et al.
(Continued)

FOREIGN PATENT DOCUMENTS

WO    2013089867 A2    6/2013
WO    2014169170 A1    10/2014
(Continued)

*Primary Examiner* — William P. Watkins, III
(74) *Attorney, Agent, or Firm* — Blank Rome LLP

(57) ABSTRACT

A composite element and methods of fabrication thereof are provided. The composite element can include a binder material and one or more electrical traces supported by the binder material, where a composition of the binder material is a thermoresponsive material and where each of the one or more electrical traces comprises an interconnected network of nanoparticles.

19 Claims, 12 Drawing Sheets

(51) Int. Cl.
*H01L 23/522* (2006.01)
*H05K 1/03* (2006.01)
H01L 33/62 (2010.01)
H01L 21/027 (2006.01)
H01L 21/311 (2006.01)
H01L 23/528 (2006.01)
H05K 1/09 (2006.01)
H01L 23/14 (2006.01)
H05K 3/20 (2006.01)
H05K 1/16 (2006.01)

(56) References Cited

U.S. PATENT DOCUMENTS

| | | |
|---|---|---|
| 9,496,229 B2 | 11/2016 | Rogers et al. |
| 2015/0289366 A1* | 10/2015 | Frey ........................ G06F 3/041 |
| | | 174/250 |
| 2016/0050750 A1 | 2/2016 | Rogers et al. |
| 2017/0006701 A1* | 1/2017 | Casasanta ............ H05K 1/0353 |
| 2017/0020402 A1 | 1/2017 | Rogers et al. |

FOREIGN PATENT DOCUMENTS

| | | | |
|---|---|---|---|
| WO | 2014169218 | A2 | 10/2014 |
| WO | 2014169218 | A3 | 10/2014 |

\* cited by examiner

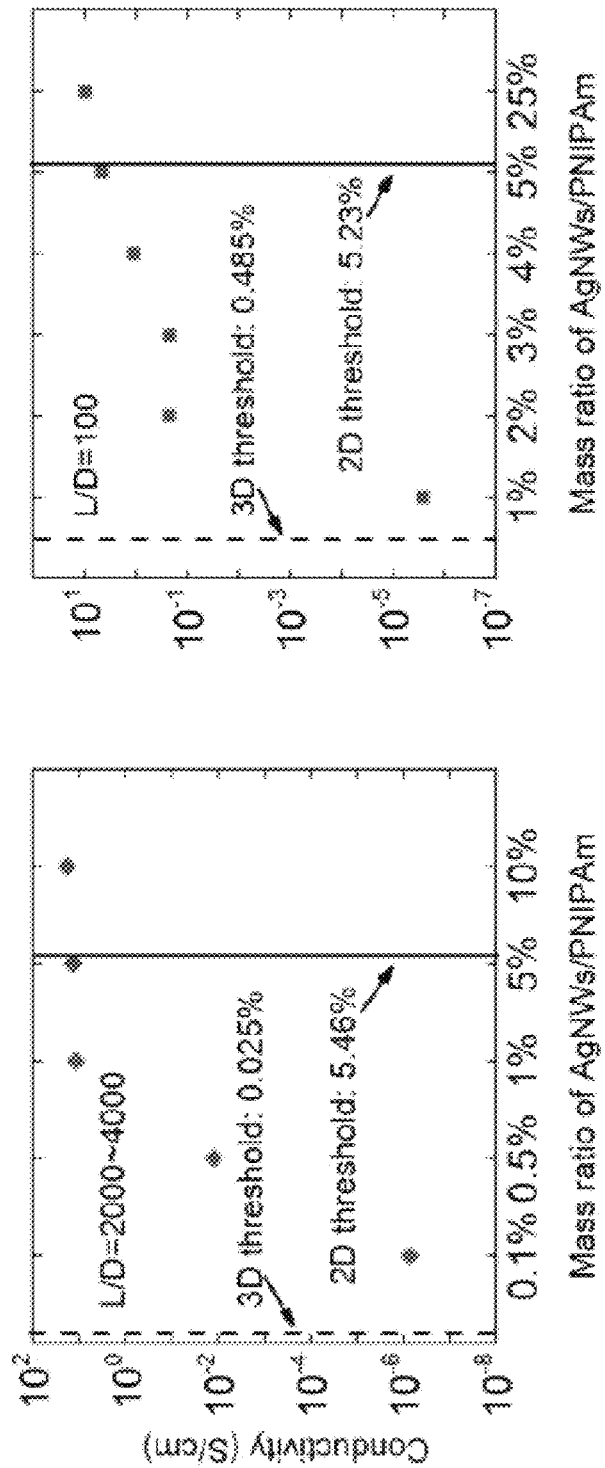

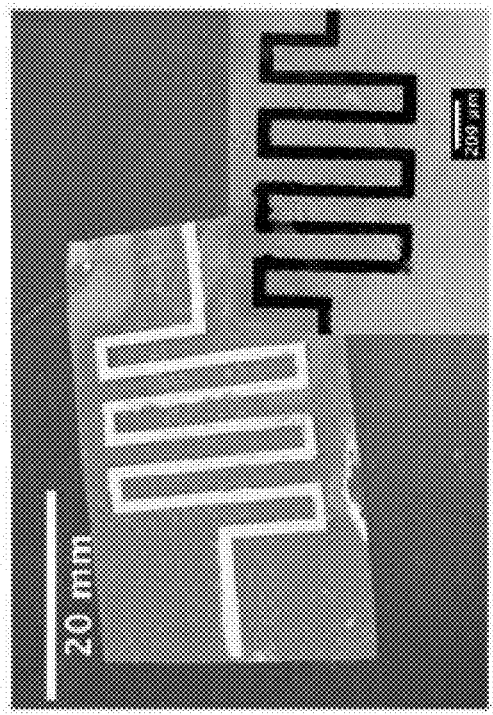
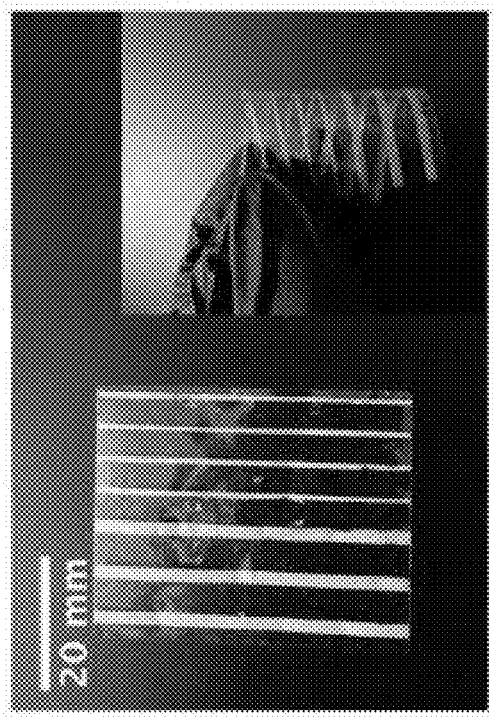
FIG. 6B
FIG. 6A

TRANSIENT ELECTRONICS USING THERMORESPONSIVE MATERIALS

CROSS-REFERENCE TO RELATED APPLICATIONS

This application claims priority to and the benefit of U.S. Provisional Patent Application No. 62/402,602, entitled "THERMORESPONSIVE TRANSIENT COMPOUND SEMICONDUCTOR DEVICE ARCHITECTURES" and filed Sep. 30, 2016, and U.S. Provisional Patent Application No. 62/468,627, entitled "THERMORESPONSIVE DISSOLVING TRANSIENT ELECTRONICS" and filed Mar. 8, 2017, the contents of both of which are hereby incorporated by reference in their entireties as if fully set forth herein.

FIELD OF THE INVENTION

The present invention relates to transient electronics, and more specifically to apparatus and methods for transient electronics using thermoresponsive materials.

BACKGROUND

Transient electronics are an emerging platform that enables the formation of circuitry designed to disintegrate and irreversibly lose function. The transient system is designed to maintain a stable electrical behavior until a stimulus, such as light, temperature or a solvent, is applied. Applications borrowed from transient technology have extended to bioresorbable electronics, energy storage devices, and secure storage systems. A critical aspect of a transient system is the mechanism for disintegration, which is fundamentally linked to the properties and behavior of the materials used for construction. The development of materials compatible with standard fabrication techniques is essential to enable the growing field of transient systems. In particular, Rogers and colleagues have investigated a range of materials to form these architectures, including Mo, Zn, W, Fe, Mg for conductive contacts; and silicon nanomembranes (Si NMs) or metal oxide (e.g. MgO) for the semiconductors combined with polymeric matrices such as silk fibroin, poly (vinyl alcohol) (PVA) and polyvinylpyrrolidone (PVP). Circuitry formed from these materials slowly dissolves in aqueous environments and thus function is lost after a predetermined period of time (linked to the dimensions of the device).

To date, the majority of transient electronics systems are based on the concept of transience induced by immersing the devices in an aqueous environment. The loss of function is due to the dissolution or destruction of construction materials. Stimulus-responsive systems that maintain a stable state but quickly disintegrate upon exposure to a specific stimulus may enable more complex behaviors and sharper transitions between the stable, functional state and the disintegrated state. Recently, thermally-induced transient devices have been demonstrated by using a coating of wax-encapsulated methanesulfonic acid on top of prefabricated electronic devices. Transient devices composed of magnesium conductive traces formed on Cylic poly(phthaladehyde) (cPPA) films fully disintegrated within 1 minute after the heat-triggered exposure to methanesulfonic acid. Photosensitive transient systems and wireless microfluidic transient systems reported in the literature have also broadened the functionality of transient devices.

Despite the foregoing, there is still a need to add certain stimulus-responsive behaviors to transient electronics systems in order to make them more practical for use in certain environments, such as inside an organism.

SUMMARY

Embodiments of the invention concern systems and methods for implementing transient electronic devices using thermoresponsive materials.

In a first embodiment of the invention, there is provided a composite element includes a binder material and one or more electrical traces supported by the binder material. In the composite element, a composition of the binder material is a thermoresponsive material, and wherein each of the one or more electrical traces includes an interconnected network of nanoparticles.

In the composite element, at least one of the electrical traces can be at least partially embedded into the binder material. Further, at least one of the electrical traces can be disposed at a surface of the binder material.

In the composite element, the nanoparticles can include nanowires. Further, the nanoparticles can be silver nanoparticles.

In the composite element, the thermoresponsive material can be a material exhibiting lower critical solution temperature (LCST) behavior. The thermoresponsive material can also be a polymer. In certain configurations, the polymer can be selected from the group consisting of methyl cellulose (MC) and poly(N-isopropylacrylamide) (PNIPAm).

In the composite element, the one or more electrical traces can define one or more passive electrical components.

In the composite element, the binder material can be shaped to have first and second opposing surfaces, and the one or more electrical traces can be disposed at the first and the second opposing surfaces.

In a second embodiment, there is provided a method for fabricating a composite element including a binder material and one or more electrical traces supported by the binder material. The method includes forming a at least one patterned layer on a substrate that includes one or more openings defining one or more exposed portions of the substrate. The method also includes depositing a nanoparticle layer over the at least one patterned layer and the exposed portions of the substrate. The method further includes removing the at least one patterned layer and a portion of the nanoparticle layer above the patterned layer so as to define a pattered nanoparticle layer on the substrate. The method additionally includes depositing a binder material over the substrate and the patterned nanoparticle layer so as to at least partially embed the patterned nanoparticle layer into the binder material and separating the binder material from the substrate. In the method, the binder material is a thermoresponsive binder material.

In the method, the forming can include depositing one or more masking layers and photolithographically patterning the one or more masking layers to define the at least one patterned layer.

In the method, the depositing can include applying a suspension of nanoparticles over the over the at least one patterned layer and the exposed portions of the substrate. The nanoparticles can be nanowires. Further, the nanoparticles can be silver nanoparticles.

In the method, the thermoresponsive material can be a material exhibiting LCST behavior. The thermoresponsive material can also be a polymer. In certain configurations, the polymer can be selected from the group consisting of methyl cellulose and poly(N-isopropylacrylamide).

In the method, exposed portions of the substrate can define one or more shapes for one or more passive electrical components.

The method can also include forming a second composite element including the binder material and one or more other electrical traces supported by the binder material and attaching the second composite element to the composite element.

BRIEF DESCRIPTION OF THE DRAWINGS

FIGS. 5A and 5B are plots of conductivity of varying mass ratio AgNWs/PNIPAm with AgNW aspect ratios L/D of 2000~4000 and 100, respectively.

FIG. 6A shows a photograph of a patterned parallel AgNW/MC conductive traces with linewidth of 2 mm and 500 um fabricated in accordance with an embodiment, where the inset shows the conductors deformed by hand.

FIG. 6B shows a photograph of patterned zigzag traces of AgNWs/MC fabricated in accordance with an embodiment, where the inset shows zigzag patterns with linewidth of 50 um.

DETAILED DESCRIPTION

Figure 1A:
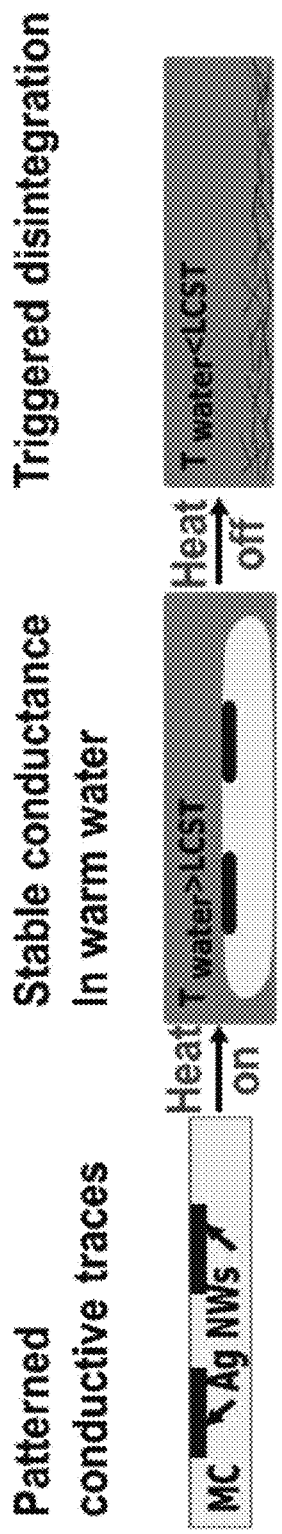
FIG. 1A schematically shows the response of a thermoresponsive transient system with silver nanowires (AgNWs) embedded in a lower critical solution temperature (LCST) polymer film in accordance with an exemplary embodiment.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The various embodiments are directed to transient electronics systems with a new stimulus-responsive behavior. In the various embodiments, this is achieved by employing certain thermoresponsive materials. For example, such thermoresponsive materials can be "binder" polymers that exhibit lower critical solution temperature (LCST) behavior, wherein the polymer is hydrophobic (and insoluble) above a threshold temperature and hydrophilic (and soluble) below that temperature. This allows one to form a transient electronic system that must be maintained in a warm solution to maintain function—disintegration and loss of function occurs when the surrounding solution cools below a threshold temperature. Such a configuration can be advantageous for use in an organism or other normally warm environment.

In certain embodiments, both methyl cellulose (MC) and Poly(N-isopropylacrylamide) (PNIPAm), with different LCST thresholds, can be employed as substrates or binder polymers for thermoresponsive transient systems. However, other materials exhibiting desirable LCST behavior can be used without limitation. For example, Poly vinylcaprolactam or Pluronic F127. In conjunction with these stimulus-responsive polymeric binders, one can employ high aspect ratio silver nanowires (AgNWs) to form a percolating conductive network, leveraging the excellent electrical conductivity and low electrical percolation threshold of such nanowires. However, the various embodiments are not limited to silver nanowires. Rather, in the various embodiments, the percolating conductive network can be formed from other non-silver nanowires or a mix of silver and non-silver nanowires. Additionally, in the various embodiments, the percolating conductive network can be formed from nanoparticles of one or more other shapes, such as spheroid shapes (including spheres), straight, curved, or bent nanowires, or any type of three-dimensional shape or combinations thereof.

As used herein, a "percolating conductive network" refers to any arrangement of nanoparticles in which there exists at least one conductive path along the arrangement (network) of nanoparticles, even if not all nanoparticles are touching.

The AgNW suspensions exhibit excellent compatibility with existing micropatterning techniques. Such suspensions include the nanoparticles, a solvent, and (optionally) a surfactant. The AgNW/polymer composite exhibits stable electrical performance when immersed in a warm water bath ($T_{water}$>LCST), but disintegrates within 5 minutes when a cooling thermal stimulus triggers the transient behavior. This process and results are shown in FIG. 1A-C.

Figure 1C:
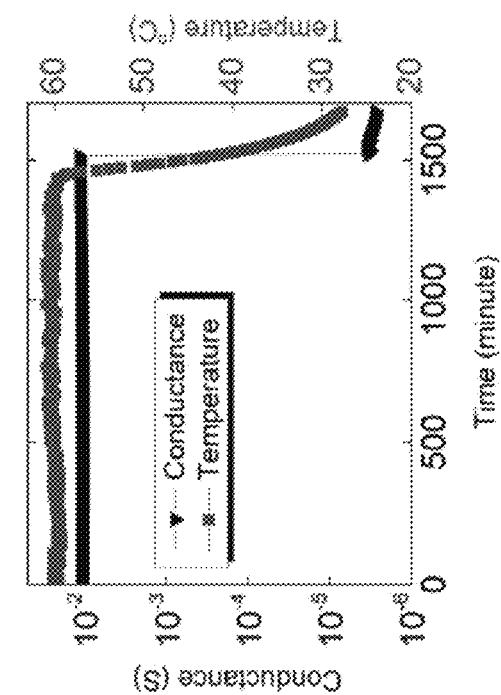
FIG. 1C is a plot showing the stability of a AgNW/MC composite over 24 hours and dramatic disintegration upon water bath cooling below LCST (approximately 45° C.).

FIG. 1A schematically shows the response of a thermoresponsive transient system with AgNWs embedded in a LCST polymer film in accordance with an exemplary embodiment. As shown in FIG. 1A, a thermoresponsive transient system with AgNWs embedded in a LCST polymer film can be provided (left). When such a system is placed in warm water ($T_{water}$>LCST), the system remains stable (middle). However, once cooled ($T_{water}$<LCST), the conductive AgNW network disintegrates as the polymer binder dissolves.

Figure 1B:
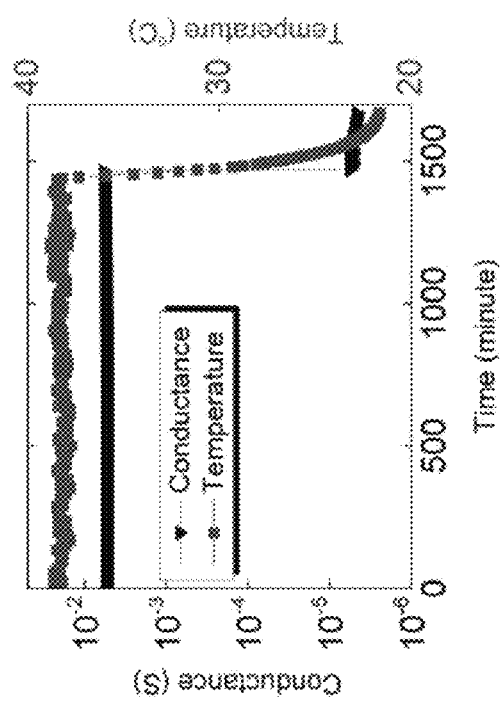
FIG. 1B is a plot showing the stability of a AgNW/PNIPAm composite over 24 hours and dramatic disintegration upon water bath cooling below LCST (approximately 32° C.).

FIG. 1B shows the stability of a AgNW/PNIPAm composite over 24 hours and dramatic disintegration upon water bath cooling below LCST (~32° C.). FIG. 1C shows the stability of a AgNW/MC composite over 24 hours and dramatic disintegration upon water bath cooling below LCST (~45° C.). In both FIGS. 1B and 1C, it is shown that as long as the temperature is maintained above the LCST of the thermoresponsive material in the composite, the composite remains intact.

In view of the foregoing, the present disclosure contemplates that the thermoresponsive electrical conductance properties of such composites can be used to form patterned conductive AgNW traces in thermoresponsive insulating substrates. Thus, such processes can be used to form circuitry incorporating transient passive components. Consequently, the present disclosure contemplates that a transient electronics platform, composed of various passive components on a thermoresponsive transient substrate can be built.

Figure 2:
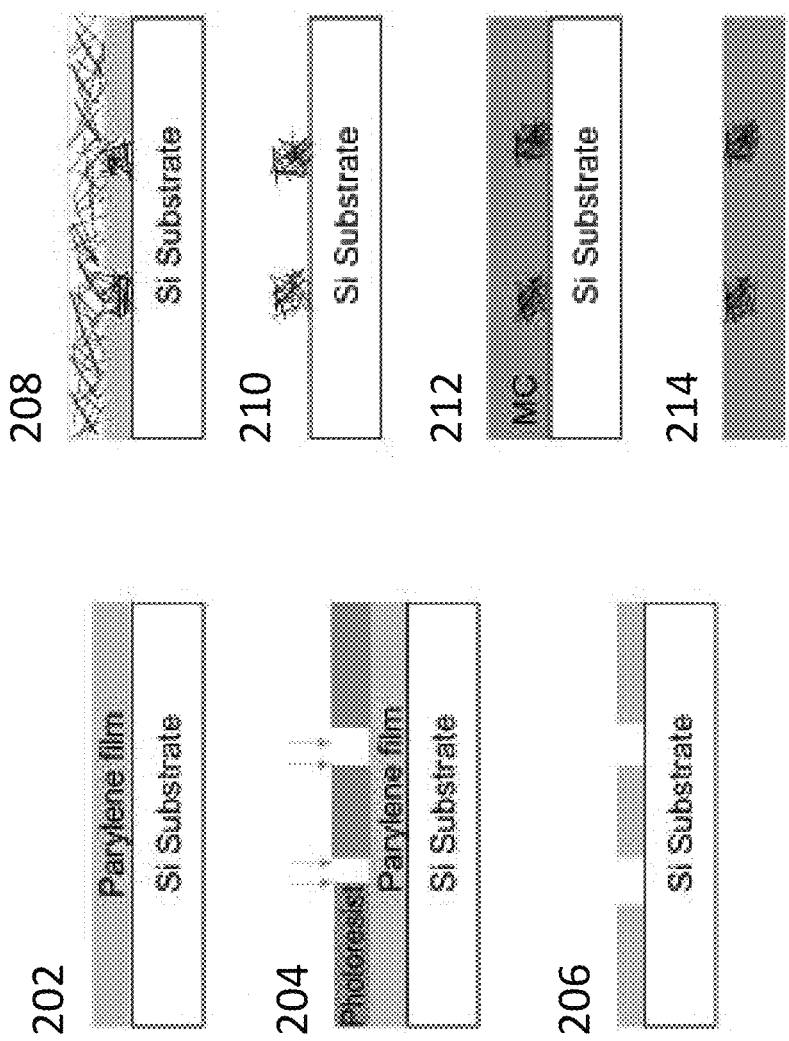
FIG. 2 shows an exemplary fabrication process 200 used to form transient systems in accordance with the various embodiments.

FIG. 2 shows an exemplary fabrication process 200 used to form transient systems in accordance with the various embodiments. First at step 202, one can deposit a layer of a stencil material, such as parylene, onto a Si wafer or other rigid substrate. Thereafter at step 204, one can form a masking layer(s) for forming a pattern in the layer of stencil material for the AgNWs. For example, as shown in FIG. 2, one can deposit one or more layers of photoresist or another type of masking materials and use photolithography techniques to form the desired pattern for the AgNWs in such layers. At step 206, one can transfer the pattern into the layer of stencil material and the masking layer can be removed. For example, exposed parylene film can be removed using an oxygen plasma and other processes can be used to selectively remove the masking layers without disturbing the remaining parylene.

Other processes, including dry and wet etch processes not described herein, can be used as needed to pattern the parylene or other layers of stencil materials. For example, a patterned stencil (formed in a polymeric film, a metal sheet, or other appropriate material) with open windows in the desired pattern could be placed against or near a wafer, and the nanoparticles deposited through this stencil. Once the nanoparticles are deposited, the stencil is removed. The removal of the stencil could be mechanical (peeling it off or otherwise separating it from the wafer), thermal (the stencil could be vaporized by placing the substrate in a high temperature environment, or the stencil could be selectively dissolved away using an appropriately chosen solvent.

Once the pattern in the layer of stencil material is formed and patterned, the composite formation can begin. First at step 208, a AgNW suspension can be cast over the whole substrate surface. Thus, the AgNW suspension covers the layer of stencil material and is also present in the pattern openings formed in the layer of stencil material. Thereafter, at step 210, the stencil material is removed. This leaves behind only the portion of the AgNW suspension in contact with the substrate deposited in the windows etched in the layer of stencil material. Consequently, as shown at 210, patterned AgNWs are formed on the surface of the substrate. Thereafter, one can deposit the thermoresponsive binder polymer over the substrate at step 212, resulting in the AgNWs being embedded into this material after the thermoresponsive binder polymer dries. In some embodiments, as shown in FIG. 212, one can spin coat methyl cellulose (MC) solution at step 212 to form a MC layer. Alternatively, one could spin coat PNIPAm or some other thermoresponsive binder polymer. Such polymers can be left to dry at ambient temperature or can optionally be dried in an oven, furnace, or the like. Once the binder polymer is deposited and the AgNWs are embedded therein, the substrate and the binder polymer can be separated, leaving AgNWs formed in the binder polymer. The AgNW/polymer composite then provides transient electronic components.

In the various embodiments, the methods described above can be used to create electronic circuits with a wide array of passive components. For example, resistors, capacitors, inductors, and antennas, to name a few. However, the various embodiments are not limited in this regard and any other types of passive components can be formed using the methods described herein.

In some embodiments three-dimensional (3D) components can be formed by forming different portions of the components in different layers of the binder polymer. For example, a parallel plate capacitor can be formed by forming a plate in a first layer of binder polymer, according to the method discussed above. The second plate can be formed in a second layer of binder polymer, according to the method discussed above, except that the first layer of binder polymer would be used as the substrate.

In some embodiments, multiple layers can be formed that are interconnected. In one exemplary process, the first layer of nanoparticles using the stencil material, prior to depositing the binder, can be used to form a patterned sacrificial template of sufficient thickness such that it isn't covered by the binder polymer when the binder is deposited. Then, after the binder polymer is deposited and dried, the sacrificial template would be selectively removed, leaving a window in the binder that would allow additional conductive particles to be patterned. Those particles could be patterned using an additional layer of stencil material. However, the various embodiments are not limited in this regard and other processes are possible.

EXAMPLES

Based on the various embodiments, several exemplary transient electronic devices were fabricated and tested, with the results provided below. The fabrication and test results for these exemplary devices are not intended to limit the various embodiments. Rather they are presented solely for illustrative purposes.

Fabrication of Thermoresponsive Transient Electronics

Parylene C was deposited onto a clean Si substrate (PDS, Specialty Coating System) to form a 3 um thick film (3 grams of parylene dimer used). Standard photolithography was used to pattern photoresist (S1813, 1000 rpm for 1 minute) on top of the parylene to serve as an etch mask. Oxygen plasma etching (Oxford RIE PlasmaPro 100 Cobra, descum for 250s) was used to remove exposed parylene. AgNW (ACS Material, AgNWs-300 and AgNWs-L50) suspension was cast on the wafer and left exposed in a fume hood for 1 hour to allow the isopropanol solvent to evaporate. Patterned AgNW traces were obtained via carefully peeling off the parylene mask. Methyl cellulose (Sigma-Aldrich 15 cp, 400 cp, 4000 cp) dissolved in trifluoroethanol (Fisher, 2,2,2-Trifluoroethanol) was spun coated onto the patterned AgNWs at 100 rpm. After drying overnight, the MC film (with embedded AgNWs) was gently peeled off the silicon wafer.

To fabricate a parallel plate capacitor, MC solution was spun coated on patterned AgNW traces at 100 rpm, and then another dry piece of AgNW/MC film (with AgNWs facing upward) was immediately placed on the still-wet MC film with the alignment as desired. Afterward, the whole substrate was placed in a fume hood overnight. In this way, the top and bottom surface of the MC film would contain parallel conductive AgNW traces to work as electrodes.

Characterization of Transient Electronics

Computer controlled hot plates (IKA/RET control-vise) were used to heat the water baths in which transient devices were immersed. A LabVIEW program was used to acquire data from electrical characterization hardware and water bath temperature measurements from the hotplates (using the hotplate's external temperature probe), and to turn off the hotplate heat source at a specific time. A Keithley 2450 sourcemeter was used to measure the electrical conductance of the AgNWs/polymer composite in both dry and wet states. The capacitor was immersed in a water bath with gold coated Kelvin Clips (Allied Electronics) connected on both ends, and the capacitance was measured using a LCR meter (Keithley U1731C) controlled by LabVIEW.

To characterize the thermoresponsive transient behavior, various formulations of AgNWs and LCST polymer were cast onto interdigitated gold electrodes and monitored the electrical conductance. When immersed in a warm water bath ($T_{water}$>LCST), the polymeric binder is hydrophobic and thus enables stable electrical conductance with negligible change over 24 hours. When the water bath is allowed to cool and the temperature drops below the LCST, the polymeric binder becomes hydrophilic and dissolves, releasing the embedded AgNWs into solution, irreversibly destroying the circuit and rendering it untraceable. The timeframe for disintegration in previous transient systems that rely on slow and steady dissolution of their components is on the order of hours or days, and similar timeframes were observed with photosensitive transient systems.

Using a AgNW/LCST polymer platform, steady electrical conductance was obtained in warm water, but extremely rapid (within minutes) loss of function upon cooling. To tune the threshold temperatures of our thermoresponsive transient systems, one can choose polymers with different LCSTs. For example, PNIPAm and MC have a LCST around 32° C. and 45° C., respectively; these polymers have been widely used as temperature-sensitive scaffolds for tissue engineering and drug delivery.

Figure 3A:
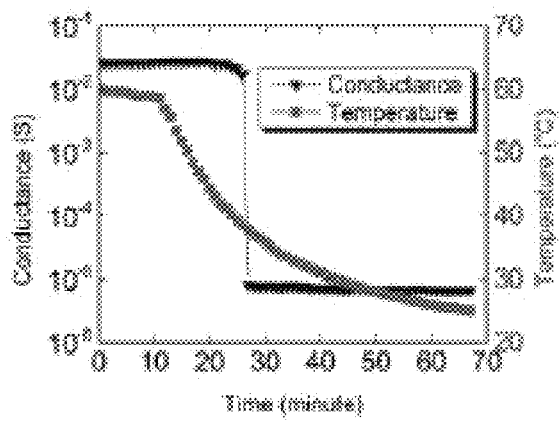
FIG. 3A shows a plot of electrical conductance of an immersed transient conductor, and water bath temperature after the bath heater is turned off. Transient behavior of methyl cellulose film (containing an embedded AgNW network) with molecular weight of 88,000.
Figure 3B:
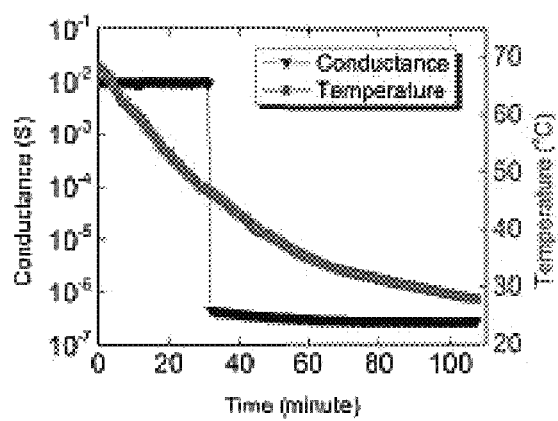
FIG. 3B shows a plot of electrical conductance of an immersed transient conductor, and water bath temperature after the bath heater is turned off Transient behavior of methyl cellulose film (containing an embedded AgNW network) with molecular weight of 41,000.
Figure 3C:
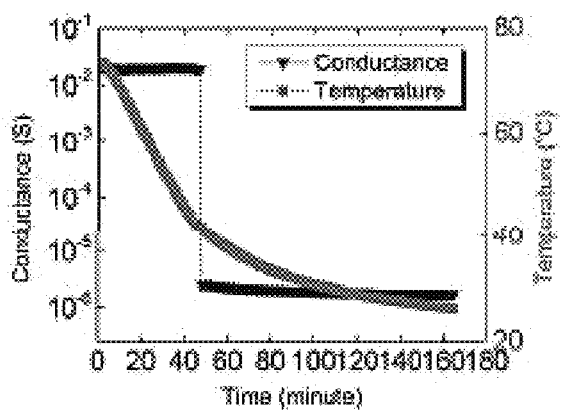
FIG. 3C shows a plot of electrical conductance of an immersed transient conductor, and water bath temperature after the bath heater is turned off Transient behavior of methyl cellulose film (containing an embedded AgNW network) with molecular weight of 14,000.

Additionally, the threshold temperature of MC with three different molecular weights (14,000, 41,000, 88,000) was compared, but there was no observation of and obvious relation between stimulus temperature and molecular weight. This is illustrated in FIGS. 3A, 3B, and 3C, which show electrical conductance of an immersed transient conductor, and water bath temperature after the bath heater is turned off, showing the transient behavior of methyl cellulose film (containing an embedded AgNW network) with molecular weight of 88,000 (FIG. 3A), 41,000 (FIG. 3B) and 14,000 (FIG. 3C).

Figures 4A, 4B, 4C:
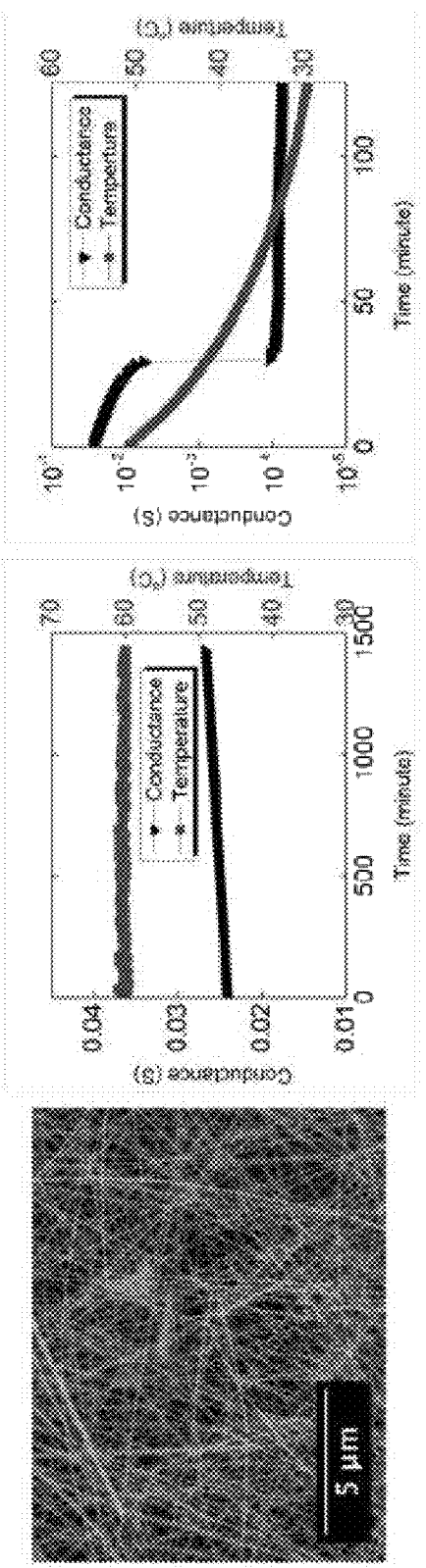
FIG. 4A shows a SEM image of AgNW network embedded within a MC film.
FIG. 4B shows a plot illustrating the stability of the electrical conductance of the AgNW network embedded in MC over 24 hours immersed in a warm water bath (change of 9.7% only)
FIG. 4C shows a plot illustrating the dramatic loss of conductivity that occurs when the water bath cools below the LCST.

The resulting AgNW networks and properties thereof are shown in FIGS. 4A-4F. FIG. 4A shows a SEM image of AgNW network embedded within a MC film. When pouring the MC solution on the AgNW pattern, the liquid infiltrates into the AgNW network but maintains the pattern of the conductive AgNW network. After drying overnight, the resulting transparent polymer film with AgNWs buried below the polymer surface can be peeled off the Si substrate. The sheet resistance of the resulting AgNW traces is ~0.4 Q/sq (conductivity of 6250 S cm$^{-1}$).

To test the transient performance of the traces, the MC substrate containing patterned AgNW networks was submersed in a warm water bath and the electrical conductance was measured using gold-coated kelvin clips applied to the two ends of the AgNW/MC trace. FIG. 4B shows a plot illustrating the stability of the electrical conductance of the AgNW network embedded in MC over 24 hours immersed in a warm water bath (change of 9.7% only). After the heat source was turned off, the conductance was stable until $T_{water}$<LCST, where a significant loss of conductance can be seen over a 5-minute period (the sampling period of the measurement), as shown in FIG. 4C. This transient behavior was reproducibly observed on multiple AgNW/MC samples. Optical images corresponding to the morphology change of the AgNW/MC film at different temperatures are provided in FIGS. 4D-4F.

Figure 4D:
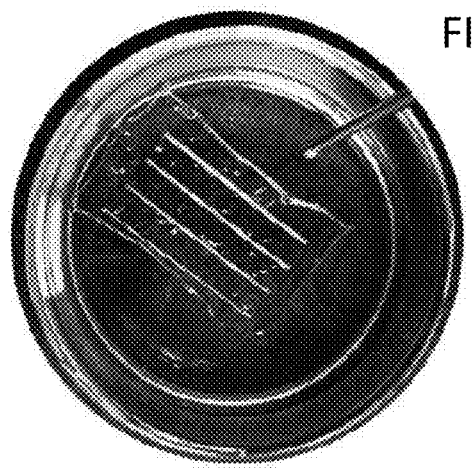
FIGS. 4D, 4E, and 4F are photographs of an AgNW network showing its morphology change in a water bath at 60° C., 38° C. and 22° C., respectively.
Figure 4E:
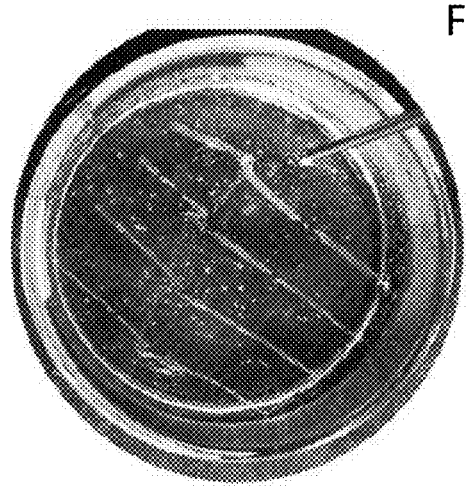
Figure 4F:
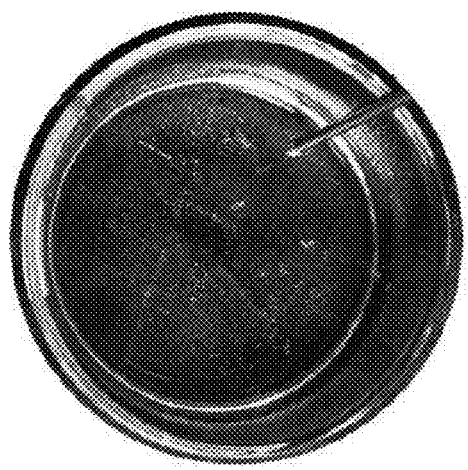

FIG. 4D shows the AgNW/MC layer immersed in warm water bath (60'C). It can be seen that water swelled the MC film but the embedded AgNW network was mechanically stable and electrical performance was not lost. When the temperature of water bath dropped below the LCST, the MC substrate became soluble in water, removing the mechanical support for the AgNW network and thus causing the destruction of the conductive network. FIG. 4F shows the disintegration of the AgNW/MC film when the water bath temperature had cooled to room temperature (22° C.). When the electrical conductance is gone, it is worth noting that rapid disintegration of the entire AgNW trace to the point of being invisible can be achieved with the aid of stirring.

In addition to testing the temperature stability of the fabricated AgNW networks, the mechanical strength and stability of these AgNW networks was also tested. In the AgNW networks fabricated, no resistance change was observed after repeated bending or twisting. Rather, the AgNW network holds its shape while embedded within the methyl cellulose matrix.

It was also observed that the electrical conductance of the transient system depends on the density of the AgNWs embedded in dielectric polymeric matrix. Therefore, the electrical percolation threshold of two different AgNWs with aspect ratios (L/D) of 100 and 2000~4000 was compared, to determine the optimal mass ratio of AgNWs/polymer. For this comparison, thin films of various AgNW/PNIPAm formulations we spin coated onto interdigitated gold electrodes to measure their conductance in both dry and wet states. The film resistance was then converted into the film conductivity. These results are shown in FIGS. 5A and 5B.

FIGS. 5A and 5B show conductivity as a function of AgNW/polymer mass ratio. In particular, these figures show conductivity of varying mass ratio AgNWs/PNIPAm with AgNW aspect ratio L/D of 2000~4000 (FIG. 5A) and 100 (FIG. 5B). Dotted lines represent the 3D theoretical electrical percolation threshold for isotropically oriented cylinders with identical aspect ratios. Solid lines represent the 2D theoretical electrical percolation threshold for isotropically oriented rectangles.

The results agree, to within an order of magnitude, with the theoretical electrical percolation prediction for isotropically oriented conductive cylinders with high aspect ratios for L/D>100. The experimental percolation threshold lies between theoretical percolation threshold of the 3D model and the 2D model. The higher percolation threshold observed in our experimental data is likely due to a somewhat anisotropic distribution of AgNWs induced by the spin coating process, such that AgNWs are likely oriented within the plane of the film.

FIG. 6A shows a patterned AgNW/MC thermoresponsive transient conductor with linewidths of 2 mm and 500 um. The inset image shows the deformed film in hand, illustrating that this is a flexible electronics system not unlike previous flexible electronics employing AgNWs patterned on elastomers. Zigzag patterns were also fabricated (FIG. 6B). Using a parylene mask, microscopic zigzag patterns were fabricated with linewidths as small as 50 um (FIG. 6B inset).

Figure 6E:
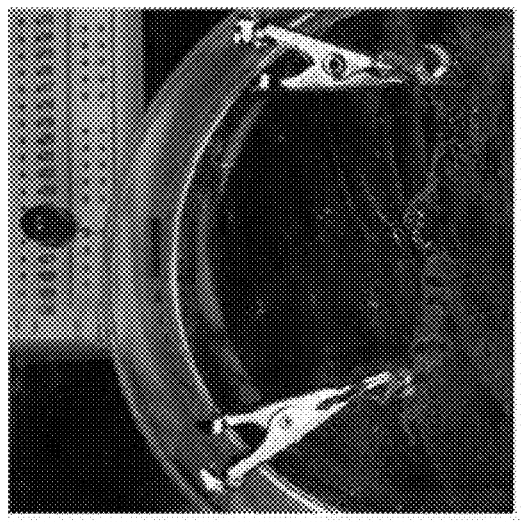
FIG. 6E shown an optical image of the LED circuit with AgNW/MC conductor submerged in cold water.
Figure 6D:
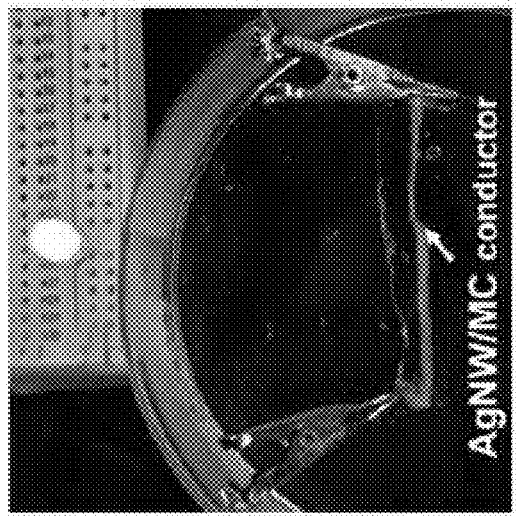
FIG. 6D shown an optical image of the LED circuit with AgNW/MC conductor submerged in warm water.
Figure 6C:
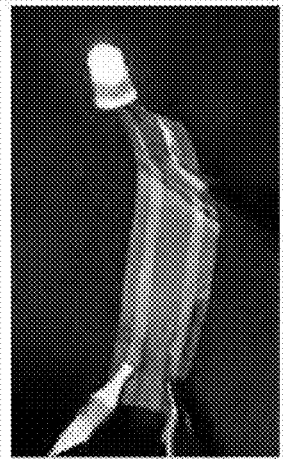
FIG. 6C shows an optical image of a deformed LED circuit.
Figure 7:
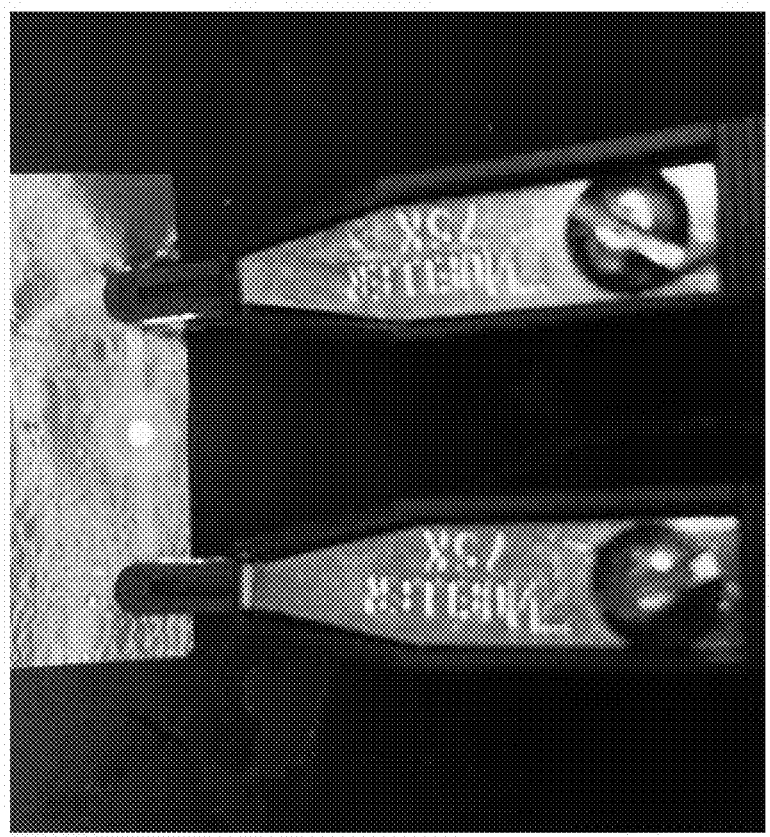
FIG. 7 is an optical image of powered SMD LED connected to 1 mm linewidth AgNW/MC traces fabricated in accordance with an embodiment.

In FIG. 6C, parallel AgNW/MC traces were employed to construct a simple circuit to light a light-emitting diode (LED). A surface-mount device (SMD) LED was also powered with a AgNW/MC trace with linewidth of 1 mm (see FIG. 7). With transient conductive AgNW/MC traces, a temperature-sensitive LED circuit was then fabricated, composed of a red LED connected in series with a piece of AgNW/MC trace (FIG. 6D). The red LED remained continuously lit for 12 hours while the AgNW/MC conductor was submerged in a warm water bath ($T_{water}$>LCST). After the heat was turned off, the red LED turned off when the colder solution temperature triggered the dissolution of MC film, leading to the destruction of the AgNW/MC circuit (FIG. 6E). The idea of thermoresponsive degradation thus offers the capability for long-term stable electrical performance as long as an appropriate stimulus was applied. It is also important to note that LCST polymer-based substrates possess the potential to integrate with other materials, such as Mg, Zn and Si NMs, to function as thermoresponsive transient electronics.

Figure 8A:
FIG. 8A is schematic showing the parallel plate capacitor formed from AgNWs and MC.
Figure 8B:
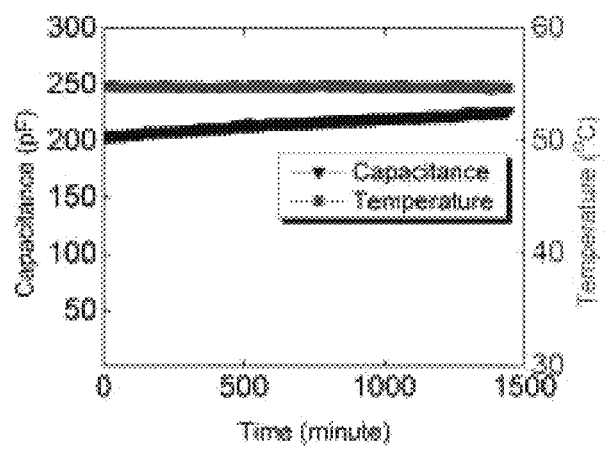
FIG. 8B is a plot showing stability of capacitance over 24 hours in warm water bath (change of ~10%).
Figure 8C:
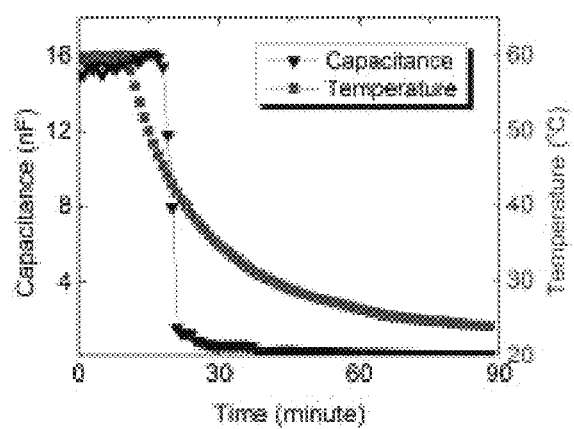
FIG. 8C is a plot showing the dramatic change in capacitance as water bath temperature drops below the LCST.

Additionally, to demonstrate the ability to form multilayer devices, a thermoresponsive capacitor was fabricated in a parallel-plate configuration. This device and its results are shown in FIGS. 8A-8C. FIG. 8A is schematic showing the parallel plate capacitor formed from AgNWs and MC. FIG. 8B is a plot showing stability of capacitance over 24 hours in warm water bath (change of ~10%). FIG. 8C is a plot showing the dramatic change in capacitance as water bath temperature drops below the LCST.

Figure 9:
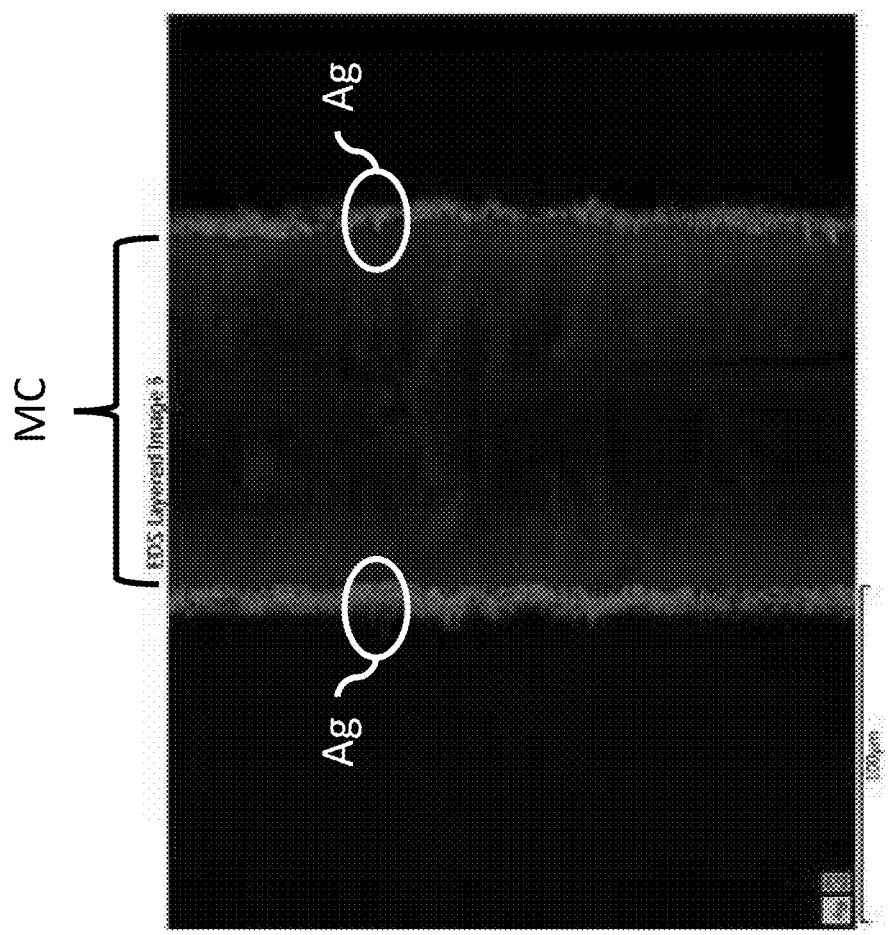
FIG. 9 which shows energy dispersive spectroscopy image of a parallel plate capacitor built by attaching two slabs of AgNW/MC film together

The device in FIG. 8A was composed of a MC slab with two patterned AgNW traces, embedded in the top and bottom surfaces, as two conductive electrodes. This is further illustrated in FIG. 9 which shows energy dispersive spectroscopy (EDS) (Zeiss Merlin with Oxford X-Max50 Silicon Drift Detector) image of a parallel plate capacitor built by attaching two slabs of AgNW/MC film together.

The thickness of the AgNW layer on each side was ~4 um, with a ~110 um MC film in the middle. When the device was immersed in a warm water bath, a stable capacitance was observed for 24 hours (FIG. 8B). The destruction of the capacitor was triggered when the water bath temperature decreased below the LCST. The capacitance change was rapid and occurred within 5 minutes (FIG. 8C). In the dry state, the capacitance was in good agreement with the theoretical prediction, given by $$C = \varepsilon_o \varepsilon_r \frac{A}{d},$$

where $\varepsilon_o$ is electric constant, $\varepsilon_r$ (~20) is the dielectric constant of dry MC film, and A and d are overlap area and gap between the two electrodes, respectively. However, when the capacitor was immersed into the water bath, a significant change in capacitance can be seen due to water penetrating into the middle MC layer, likely changing the gap between electrodes and dielectric constant.

In conclusion, the results above demonstrate that LCST polymers, such as PNIPAm and MC, provide thermoresponsive materials for transient electronics applications. AgNW/MC conductive traces were fabricated by embedding AgNWs below the surface of MC film. Stable electrical conductivity in solution was monitored for 24 hours until thermal cooling stimulus was applied to rapidly initiate degradation. The loss of electrical conductance is due to the conductive AgNW network being released from the polymeric binders, causing irreversible physical destruction of the whole circuit. Employing a parylene patterning technique, we formed straight and zigzag patterns of AgNWs at scales ranging from the macroscopic to microscopic. Moreover, a temperature-responsive LED circuit and a capacitor were built using the AgNW/MC conductors. With stable electrical performance in a warm water environment, thermally-induced disintegration (e.g. heat is required for the circuit to remain viable) and compatibility with standard fabrication techniques, the reported thermoresponsive transient conductive composites open up new possibilities for exciting applications employing stimulus-responsive transient electronic devices.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A transient electrical circuitry system comprising:
   binder material comprising a thermoresponsive material exhibiting lower critical solution temperature (LCST) behavior; and
   one or more electrical traces supported by the binder material, wherein each of the one or more electrical traces comprises an interconnected network of nanoparticles;
   wherein the binder material is in the form of a gel, while the thermoresponsive material is above the LCST, resulting in a maintaining of electrically conductive function of the one or more electrical traces; and
   wherein the binder material is in the form of a liquid, when the thermoresponsive material is below the LCST, resulting in a loss of the electrically conductive function of the one or more electrical traces.

2. The transient electrical circuitry system of claim 1, wherein at least one of the one or more electrical traces is at least partially embedded into the binder material.

3. The transient electrical circuitry system of claim 1, wherein at least one of the one or more electrical traces is disposed at a surface of the binder material.

4. The transient electrical circuitry system of claim 1, wherein the nanoparticles comprise nanowires.

5. The transient electrical circuitry system of claim 1, wherein the nanoparticles comprise silver nanoparticles.

6. The transient electrical circuitry system of claim 1, wherein the thermoresponsive material is a polymer.

7. The transient electrical circuitry system of claim 6, wherein the polymer is selected from the group consisting of methyl cellulose and poly(N-isopropylacrylamide).

8. The transient electrical circuitry system of claim 1, wherein the one or more electrical traces defines one or more passive electrical components.

9. The transient electrical circuitry system of claim 1, wherein the binder material is shaped to have first and second opposing surfaces, and wherein the one or more electrical traces is disposed at the first and the second opposing surfaces, while the binder material is in the form of the gel.

10. A method for fabricating a transient electrical circuitry system, the method comprising:
    forming at least one patterned layer on a substrate comprising one or more openings defining one or more exposed portions of the substrate;
    depositing a nanoparticle layer over the at least one patterned layer and the one or more exposed portions of the substrate;
    removing the at least one patterned layer and a portion of the nanoparticle layer above the at least one patterned layer so as to define a patterned nanoparticle layer on the substrate;
    depositing a binder material over the substrate and the patterned nanoparticle layer so as to at least partially embed the patterned nanoparticle layer into the binder material; and
    separating the binder material from the substrate,
    wherein the binder material comprises a thermoresponsive material exhibiting lower critical solution temperature (LCST) behavior;
    wherein the patterned nanoparticle layer is in the form of one or more electrical traces;
    wherein the binder material is in the form of a gel, while the thermoresponsive material is above the LCST, resulting in a maintaining of electrically conductive function of the one or more electrical traces; and
    wherein the binder material is in the form of a liquid, when the thermoresponsive material is below the LCST, resulting in a loss of the electrically conductive function of the one or more electrical traces.

11. The method of claim 10, wherein the forming comprises depositing one or more masking layers and photolithographically patterning the one or more masking layers to define the at least one patterned layer.

12. The method of claim 11, wherein the depositing of the nanoparticle layer comprises applying a suspension of nanoparticles over the at least one patterned layer and the one or more exposed portions of the substrate.

13. The method of claim 12, wherein the nanoparticles comprise nanowires.

14. The method of claim 12, wherein the nanoparticles comprise silver nanoparticles.

15. The method of claim 10, wherein the thermoresponsive material is a polymer.

16. The method of claim 15, wherein the polymer is selected from the group consisting of methyl cellulose and poly(N-isopropylacrylamide).

17. The method of claim 10, wherein the one or more exposed portions of the substrate further defines one or more shapes for one or more passive electrical components.

18. The method of claim 10, further comprising:
    forming a second transient electrical circuitry system comprising the binder material and one or more other electrical traces supported by the binder material;
    attaching the second transient electrical circuitry system to the transient electrical circuitry system.

19. A transient electrical circuitry system comprising:
    binder material comprising a thermoresponsive polymeric material exhibiting lower critical solution temperature (LCST) behavior, the thermoresponsive polymeric material being selected from the group consisting of methyl cellulose and poly(N-isopropylacrylamide); and
    one or more electrical traces supported by the binder material, wherein each of the one or more electrical traces comprises an interconnected network of nanoparticles, the nanoparticles comprising nanowires or silver nanoparticles;
    wherein the binder material is in the form of a gel, while the thermoresponsive polymeric material is above the LCST, resulting in a maintaining of electrically conductive function of the one or more electrical traces; and
    wherein the binder material is in the form of a liquid, when the thermoresponsive polymeric material is below the LCST, resulting in a loss of the electrically conductive function of the one or more electrical traces.

\* \* \* \* \*